(12) United States Patent
Borsi et al.

(10) Patent No.: US 7,292,048 B2
(45) Date of Patent: Nov. 6, 2007

(54) METHOD AND APPARATUS FOR MEASURING A DIELECTRIC RESPONSE OF AN ELECTRICAL INSULATING SYSTEM

(75) Inventors: Hossein Borsi, Hannover (DE); Ernst Gockenbach, Burgdorf (DE); Michael Krüger, Altach (AT)

(73) Assignee: Omicron Electronics GmbH, Klaus (AT)

( * ) Notice: Subject to any disclaimer, the term of this patent is extended or adjusted under 35 U.S.C. 154(b) by 0 days.

(21) Appl. No.: 11/445,078

(22) Filed: May 31, 2006

(65) Prior Publication Data

US 2006/0279292 A1    Dec. 14, 2006

(30) Foreign Application Priority Data

Jun. 2, 2005    (DE)    ........... 10 2005 025 449

(51) Int. Cl.
*G01R 27/28* (2006.01)
*G01R 31/06* (2006.01)
*H01H 31/12* (2006.01)

(52) U.S. Cl. ............ 324/632; 324/547; 324/551; 324/553

(58) Field of Classification Search .......... 324/632, 324/547, 551, 553
See application file for complete search history.

(56) References Cited

OTHER PUBLICATIONS

Zaengl, Walter S., "Applications of Dielectric Spectroscopy in Time and Frequency Domain for HV Power Equipment", Nov./Dec. 2003, IEEE Electrical Insulation Magazine, vol. 19, No. 6, pp. 9-22.*

Zaengl, Dielectric spectroscopy in time and frequency domain for HV power equipment. I. Theoretical considerations; In: Electrical Insulation Magazine, IEEE, 19(5):5-19 (2003).

Fuhr et al., Experience with diagnostic tools for condition assessment of large power transformers; In: Electrical Insulation 2004. Conference Record of the 2004 IEEE International Symposium on 2004, pp. 508-511.

A. Helgeson, "Dielectric Properties of Machine Insulation Studied with Dielectric Response", Kungl Tekniska Högskolan, ISSN 1100-1593, Chapter 6, p. 112, May 12, 1997.

A. Helgeson, "Dielectric Response Measurements in Time and Frequency Domain on High Voltage Insulation with Diferent Response", International Symposium on Electrical Insulation Materials, Toyohashi, Japan, pp. 393-398, Sep. 27-30, 1998.

A. Helgeson, "Analysis of Dielectric Response Measurement Methods and Dielectric Properties of Resin-Rich Insulation During Processing", Kungl Tekniska Högskoln, ISSN 1100-1593, Chapter 4, pp. 55-57, Apr. 28, 2000.

* cited by examiner

*Primary Examiner*—Walter Benson
*Assistant Examiner*—Timothy J Dole
(74) *Attorney, Agent, or Firm*—Peter F. Corless; Christine C. O'Day; Edwards Angell Palmer & Dodge LLP

(57) ABSTRACT

Method and device for measuring a dielectric response of an electrical insulating system, wherein a first measurement result is determined by a frequency domain method and a second measurement result is determined by a time domain method, whereupon the first measurement result and the second measurement result are combined to form an overall measurement result as the dielectric response. Standard types of measurement methods, for example the FDS and PDC methods, may be used as measurement methods for the frequency domain and the time domain.

13 Claims, 1 Drawing Sheet

Fig. 1)
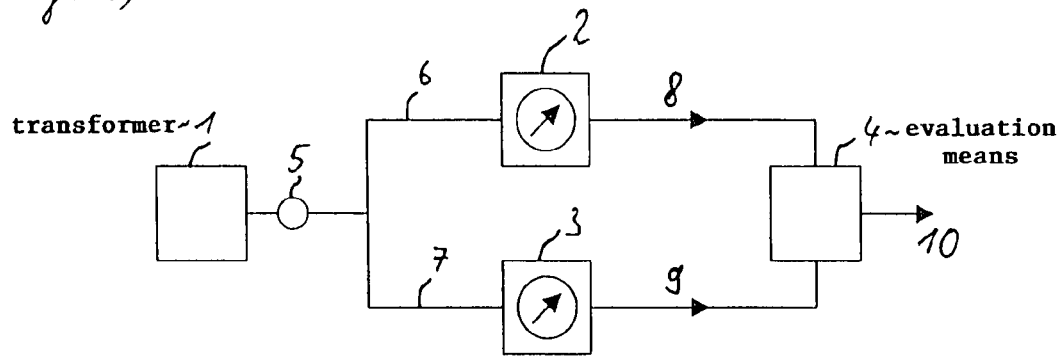
Fig. 2a)
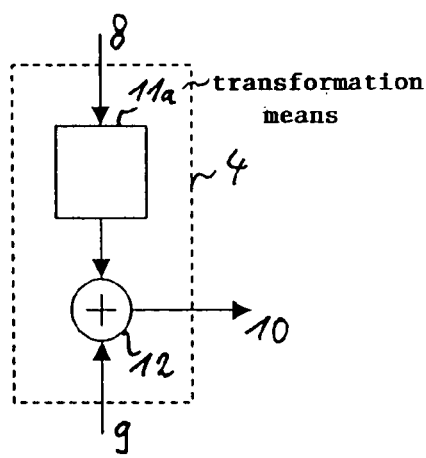
Fig. 2b)
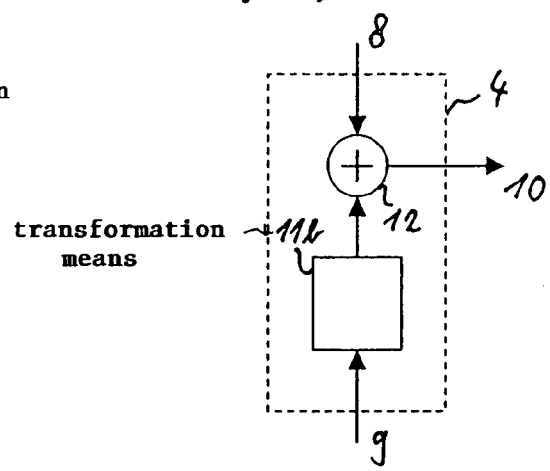
Fig. 3)
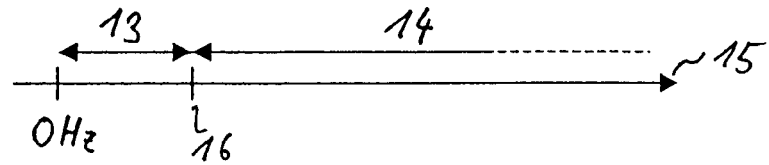

METHOD AND APPARATUS FOR MEASURING A DIELECTRIC RESPONSE OF AN ELECTRICAL INSULATING SYSTEM

The present invention relates to a method and an apparatus for measuring a dielectric response of an electrical insulating system, wherein an overall measurement result is combined as the dielectric response from a first measurement result of a frequency domain method and a second measurement result of a time domain method.

Electrical insulating systems are used for insulation purposes in power transformers, as employed for example by power companies. Such transformers are important and cost-intensive components of electrical power supply networks, and worldwide generally have a high operating age. The power companies therefore have a great interest in being provided with measures for lifetime extension and load optimisation of power transformers. To this end it is necessary to assess the status of the transformers, which can be done by various diagnostic methods in situ. Such diagnostic methods are intended to assess the extent to which, for example, a risk potential due to electrical, thermal or mechanical stress is no longer acceptable and measures must be taken for servicing, maintenance or renovation. Besides the early detection of critical plant statuses, such diagnostic methods should also be suitable for carrying out servicing work on the plant only when the status requires this. The use of diagnostic systems is intended, in particular, to achieve an extension of the remaining service life, a better capacity utilisation, higher availability and supply security, status-oriented servicing and maintenance and prevention of failure and destruction of the transformer.

Distinction is made between online and offline methods as diagnostic methods, i.e. methods which can be carried out during operation or only during a pause in operation. In detail, the methods can be further subdivided into chemical, electrical, dielectric and other non-electrical methods. Dielectric methods are distinguished particularly in that they offer a more accurate view of the insulating system and information about its status. Compared to chemical methods, electrical/dielectric methods furthermore offer information about the present status of power transformers. The prior art of dielectric methods will therefore be discussed in more detail below.

The so-called RVM (recovery voltage measurement) method represents a first dielectric method. It is characterized in that a DC voltage is first applied to the terminals of the transformer for a particular time. Polarisation processes in the dielectric are thereby put in motion such that, after an abrupt rise, the polarisation current decreases hyperbolically until the time at which the DC voltage is switched off. After this concomitant charging of the dielectric and switching off the DC voltage, the terminals of the transformer are short-circuited so that a likewise hyperbolically decaying but oppositely directed depolarization current is induced. After a particular time, the short circuit is released and a so-called recovery voltage is set up, which can be measured at the terminals of the transformer. This recovery voltage is caused by the relaxation processes in the dielectric. Since the relaxation processes correlate with the status of the insulating material, conclusions about the status of the insulating material can be drawn from the profile of the recovery voltage, which constitutes the principle of the RVM measurement.

Another method for determining the status of an electrical insulating system on power transformers is provided by a so-called PDC (polarisation and depolarization current) analysis. In particular, the state of ageing and the humidity of the insulation can thereby be determined. The PDC method is based on generating an electric field on the insulation by a DC voltage at the terminals of the transformer, and measuring the polarisation current caused by this. The DC voltage is subsequently removed and the depolarization current is measured. From the polarisation current and the depolarization current, and by taking into account the capacitance of the dielectric material, it is possible to determine the response function and the conductance of the insulation.

A third method which may be mentioned according to the prior art for measuring the status of the insulation is an FDS (frequency domain spectroscopy) method. This method is based on a generalization of the known tan δ measurement at mains frequency. In contrast thereto, however, many different measurements are carried out at various frequencies in FDS. With a new system, it is possible to measure wide frequency ranges of between 0.1 mHz and 1 kHz, the measurement principle being configured as follows. A sinusoidal signal of the desired frequency is generated with the aid of a digital signal processor, then this is amplified and applied to the terminals of the transformer. The terminal voltage of the transformer and the current through the transformer due to this are measured. Both the capacitance and the loss factor tan δ of the transformer are determined therefrom as a function of the frequency. In this way, the status of the insulating system of a power transformer is assessed by the FDS method.

All these methods suffer from the disadvantage that in certain subregions of the relevant frequency range, typically from 0.1 mHz to a few hundred hertz, they provide very poor results or none at all, or require a very long measurement time. For example, the FDS method has the essential disadvantage that it requires a very long measurement duration in the very low frequency range. For the time domain, the PDC measurement method has the disadvantage that a measurement is virtually impossible for times of less than 1 second since the specimen capacitance has to be discharged during this time.

Compared to the FDS and PDC methods, the RVM method has the serious disadvantage that the recovery voltages are influenced therein by material and geometrical properties in a way which is difficult to ascertain, so that there is no method by which the two influences can be separated.

It is therefore an object of the present invention to provide a method and an apparatus for measuring a dielectric response of an electrical insulating system, rapid and informative measurement being possible over the entire relevant frequency range of typically from 0.1 mHz to about a few hundred hertz.

According to the invention, the object is achieved in a defined way by a method and an apparatus for measuring a dielectric response of an electrical insulating system through the features of independent claims 1 and 11, respectively. The dependent claims define preferred and advantageous exemplary embodiments of the present invention.

The method according to the invention for measuring a dielectric response of an electrical insulating system consists in determining a first measurement result by a frequency domain method and a second measurement result by a time domain method, whereupon the first measurement result and the second measurement result are combined to form an overall measurement result as the dielectric response.

In this way, it is possible to compensate for the disadvantageous behaviour of one method in particular ranges by the positive effect of another method in these ranges. To this end, the dielectric response in low frequency ranges (preferably up to about 1 Hz) is determined by a PDC measurement and transferred into the frequency domain with the aid of mathematical algorithms. It is therefore no longer necessary for an FDS measurement to be carried out for very low frequencies; it may be used instead exclusively above about 1 Hz. It is very straightforward and cost-effective to carry out a loss factor and capacitance measurement (FDS) for frequencies above 1 Hz. The essential disadvantage of the FDS method in the low-frequency range, due to its very long measurement duration, is thus compensated for by the use of a PDC measurement for this frequency range.

The essential disadvantage of the PDC measurement, which is that a sensitive and meaningful measurement is not possible at very short times (less than 1 s after short-circuiting the specimen) so that essential information is lost at the start of the measurement, is compensated for by using the FDS method which readily provides good results in the higher-frequency range. In short, this means that the combination of a PDC measurement and an FDS measurement can evaluate all information due to the polarisation and depolarization processes in a short measurement time, and that the overall measurement system can be made more versatile and simpler.

In one preferred exemplary embodiment, the first measurement result of the frequency domain method (FDS) is transformed into an equivalent representation in the time domain and combined with the second measurement result of the time domain method (PDC) to form an overall measurement result represented in the time domain.

In another exemplary embodiment, the second measurement result of the time domain method (PDC) is transformed into an equivalent representation in the frequency domain and combined with the first measurement result of the frequency domain method (FDS) to form an overall measurement result represented in the frequency domain.

The transformations both from the time domain into the frequency domain and from the frequency domain into the time domain can be carried out by means of mathematical algorithms, for example Fourier transform or inverse Fourier transform.

In a further exemplary embodiment, the two frequency ranges are divided up in such a way that the time domain method is applied to a first frequency range and the frequency domain method is applied to a second frequency range, the first frequency range comprising a lower cut-off frequency of from 0 Hz to a few tenths of mHz and a particular upper cut-off frequency of from 1 Hz to a few hertz, and the second frequency range comprising all frequencies above the upper cut-off frequency of the first frequency range, which forms a lower cut-off frequency of the second frequency range.

In a further exemplary embodiment, an AC measurement signal and a DC measurement signal are generated by an amplifier in order to measure the dielectric insulating system, the measurement method being capable of measuring both very small DC measurement signal currents and loss factors beyond about 1 Hz.

The diagnosis of the status of the electrical insulating system can be carried out simply by evaluating the overall measurement result, to which end calibration in the time and frequency domains as well as an expert system may be employed.

The present invention may advantageously be used to measure the dielectric response of an electrical insulating system of a power transformer, but without being restricted to this preferred field of application.

The present invention will be explained in more detail below with reference to the appended drawings with the aid of preferred exemplary embodiments.

FIG. 1 shows a block diagram of the structure of a system according to the invention for measuring a dielectric response of an electrical insulating system.

FIG. 2a shows a block diagram of the combination of two measurement results, a first measurement result of the frequency domain method being transformed into the time domain.

FIG. 2b shows a block diagram of the combination of two measurement results according to the invention, a second measurement result of the time domain method being transformed into the frequency domain.

FIG. 3 shows a division of the frequency spectrum for the frequency domain method and the time domain method.

FIG. 1 represents a block diagram of a preferred exemplary embodiment for measuring a dielectric response of an electrical insulating system. A frequency domain measurement means 2 is connected to one terminal 5 of a transformer 1 via a connection 6. A time domain measurement means 3 is likewise connected to the terminal 5 via a connection 7. A first measurement result 8 determined by the frequency domain measurement means 2 is forwarded to an evaluation means 4. A second measurement result 9 determined by the time domain measurement means 3 is likewise delivered to the evaluation means 4. From the first measurement result 8 and the second measurement result 9, the evaluation means 4 calculates an overall measurement result 10 for the dielectric response.

The frequency domain method used by the frequency domain measurement means 2 may, for example, be an FDS method which determines a loss factor and a capacitance of the insulating material for frequencies above 1 Hz. Very simple and cost-effective measuring instruments are available for a frequency range above 1 Hz. For example, AC measurement signals and DC measurement signals are generated by such a measuring instrument via an amplifier, and applied to the transformer terminal 5. Both very small DC measurement signal currents and loss factors are thereby measured beyond about 1 Hz, which provide information about the status of the insulating material.

The time domain measurement means 3 is designed for example as a PDC measurement means. The polarisation and depolarization currents are preferably measured for frequencies of less than 1 Hz according to the PDC method. A measurement over a time span longer than one second is necessary for this. By using the PDC measurement method in the low-frequency range, the measurement time is shortened substantially compared with using the FDS method for the entire desired frequency spectrum.

The frequency domain measurement means 2 and the time domain measurement means 3 may in principle perform the functions of conventional FDS and PDC measuring instruments, although with the proviso that according to the invention the different measurement methods are applied to different frequency ranges.

FIG. 2a represents a configuration of the evaluation means 4 according to the invention, in the form of a combination of the first measurement result 8 of the frequency domain method 2 and the second measurement result 9 of the time domain method 3 to form the overall measurement result 10 as a dielectric response. The first measurement result 8 is transformed into an equivalent measurement result in the time domain with the aid of a transformation 11*a*, for example an inverse Fourier transform. This equivalent measurement result in the time domain is then combined with the second measurement result 9 of the time domain method 3 by means of a combination means 12 to form the overall measurement result 10 in the time domain.

FIG. 2*b* shows a similar configuration of the evaluation means 4 of FIG. 2*a*. Here, however, the second measurement result 9 of the time domain method 3 is transformed 11*b* into an equivalent measurement result in the frequency domain, for example by means of a Fourier transform. This equivalent measurement result in the frequency domain is combined with the first measurement result 8 of the frequency domain method 2 by means of the combination means 12 to form the overall measurement result 10 in the frequency domain.

The essential difference between configuring the evaluation means 4 according to FIG. 2*a* or according to FIG. 2*b* is that in one case the overall measurement result 10 is provided in the time domain, and in the other case the overall measurement result 10 is provided in the frequency domain. A configuration of the evaluation means 4 either according to FIG. 2*a* or according to FIG. 2*b* may therefore be selected as a function of the desired representation of the overall measurement result for the subsequent post-processing steps. This ensures flexible usability of the invention with conventional measurement result processing means.

Both the variant of FIG. 2*a* and the variant of FIG. 2*b* may of course be implemented in the same measurement system or measuring instrument, so as to be able to switch over between the two variants or the corresponding measurement results.

FIG. 3 represents the division of the frequency band between the two different measurement methods. The time domain method 3 is applied to a first frequency range 13, which comprises a lower cut-off frequency of from 0 Hz to a few tenths of mHz (preferably 0.1 mHz) and an upper cut-off frequency of e.g. from 1 Hz-several hertz. A second frequency range 14 starting at the lower cut-off frequency 16, which is identical to the upper cut-off frequency of the lower frequency range 13, extends as far as an upper cut-off frequency which represents the upper limit of the desired total measurement range, for example a few hundred hertz. A pure PDC method, which is suitable for low frequencies particularly in view of a short measurement duration as well as a high measurement accuracy, is more preferably used for the measurement in the lower frequency range 13. An FDS method is used according to the invention for the second frequency range 14. Measurements with a loss-factor and capacitance measuring instrument are very readily and cost-effectively possible for this, in particular for frequencies above 1 Hz. The lower cut-off frequency 16 of the second frequency range 14 is therefore more preferably placed at about 1 Hz. In general it is advantageous for the widest possible frequency range to be covered by using a lower cut-off frequency of the first frequency range which is relatively low, and an upper cut-off frequency of the first frequency range which is as high as possible.

By the method according to the invention and the device according to the invention, therefore, the status of an electrical insulating system can be determined in a short time with a high measurement accuracy and therefore economically through a combination of two measurement results of conventional measurement methods, for example FDS and PDC methods.

The invention claimed is:

1. Method for measuring a dielectric response of an electrical insulating system, comprising
   determining a first measurement result of the electrical insulating system by a frequency domain method,
   and determining a second measurement result of the electrical insulating system by a time domain method,
   and combining the first measurement result and the second measurement result to form an overall measurement result as the dielectric response.

2. Method according to claim 1, wherein the first measurement result of the frequency domain method is transformed into an equivalent representation in the time domain and combined with the second measurement result of the time domain method to form an overall measurement result represented in the time domain.

3. Method according to claim 1, wherein the second measurement result of the time domain method is transformed into an equivalent representation in the frequency domain and combined with the first measurement result of the frequency domain method to form an overall measurement result represented in the frequency domain.

4. Method according to claim 1, wherein a measurement of a loss factor tan $\delta$ and a capacitance of the electrical insulating system is used as the frequency domain method, and a polarisation/depolarization current measurement of the electrical insulating system is used as the time domain method.

5. Method according to claim 1, wherein the time domain method is applied to a first frequency range and the frequency domain method is applied to a second frequency range, the first frequency range of the two frequency ranges comprising a lower cut-off frequency and an upper cut-off frequency, and the second frequency range comprising a lower cut-off frequency which corresponds to the upper cut-off frequency of the first frequency range.

6. Method according to claim 5, wherein the lower cut-off frequency of the first frequency range is from 0 Hz to a few tenths of mHz, and the upper cut-off frequency of the first frequency range is from 1 Hz to a few hertz.

7. Method according to claim 1, wherein the status of the electrical insulating system is diagnosed with the aid of a calibration in the time domain and frequency domain.

8. Method according to claim 1, wherein the status of the electrical insulating system is diagnosed with the aid of an expert system.

9. Apparatus for measuring a dielectric response of an electrical insulating system, comprising
   a frequency domain measurement device for determining a first measurement result of the electrical insulating system in the frequency domain,
   a time domain measurement device for determining a second measurement result of the electrical insulating system in the time domain, and
   an evaluation device, which is designed so that it combines the first measurement result and the second measurement result to form an overall measurement result as the dielectric response.

10. Apparatus according to claim 9, wherein the evaluation device contains transformation means for transforming a first measurement result delivered by the frequency domain measurement device from the frequency domain into an equivalent measurement result in the time domain, in order to generate an overall result by means of combination means which are supplied with this equivalent measurement result in the time domain and the second measurement result delivered by the time domain measurement device.

11. Apparatus according to claim 9, wherein the evaluation device contains transformation means for transforming a second measurement result delivered by the time domain measurement device from the time domain into an equivalent measurement result in the frequency domain, in order to generate an overall result by means of combination means which are supplied with this equivalent measurement result in the frequency domain and the first measurement result delivered by the frequency domain measurement device.

12. Apparatus according to claim 9, wherein the apparatus is designed for diagnosing the status of the electrical insulating system.

13. Apparatus according to claim 12, wherein the apparatus is designed for diagnosing the status of the electrical insulating system with the aid of a calibration in the time and frequency domains and by using an expert system.

* * * * *